US012793757B2

(12) United States Patent
Yoon et al.

(10) Patent No.: US 12,793,757 B2
(45) Date of Patent: Nov. 10, 2026

(54) INPUT/OUTPUT INTERFACE CIRCUIT AND MEMORY SYSTEM INCLUDING THE SAME

(71) Applicant: SAMSUNG ELECTRONICS CO., LTD.

(72) Inventors: Sungwoo Yoon, Suwon-si (KR); Jaemin Choi, Suwon-si (KR); Changsik Yoo, Suwon-si (KR); Ki-Heung Kim, Suwon-si (KR); Hoseok Seol, Suwon-si (KR); Youngdo Um, Suwon-si (KR); Hyongryol Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 18/937,774

(22) Filed: Nov. 5, 2024

(65) Prior Publication Data

US 2025/0149077 A1 May 8, 2025

(30) Foreign Application Priority Data

Nov. 7, 2023 (KR) ........................ 10-2023-0153033
Feb. 16, 2024 (KR) ........................ 10-2024-0022952

(51) Int. Cl.

| | |
|---|---|
| ***G11C 8/18*** | (2006.01) |
| ***G11C 8/06*** | (2006.01) |
| ***G11C 11/4096*** | (2006.01) |
| ***H03K 19/173*** | (2006.01) |
| ***H03K 21/08*** | (2006.01) |

(Continued)

(52) U.S. Cl.
CPC ................. *G11C 8/18* (2013.01); *G11C 8/06* (2013.01); *G11C 11/4096* (2013.01); *H03K 19/1737* (2013.01); *H03K 21/08* (2013.01); *G11C 7/1078* (2013.01); *G11C 7/222* (2013.01); *G11C 8/12* (2013.01)

(58) Field of Classification Search
CPC .. G11C 8/18; G11C 8/06; G11C 7/222; G11C 8/12; G11C 11/4096; G11C 7/1078; H03K 19/1737; H03K 21/08
See application file for complete search history.

(56) References Cited

U.S. PATENT DOCUMENTS 9,384,818 B2 7/2016 Adelman et al.
10,559,550 B2 2/2020 Lee et al.

(Continued)

OTHER PUBLICATIONS

Communication dated Mar. 18, 2025 issued by the European Patent Office in Application No. 24208398.8.

*Primary Examiner* — Alexander Sofocleous
*Assistant Examiner* — Joseph Fidelis Stormes
(74) *Attorney, Agent, or Firm* — Sughrue Mion, PLLC

(57) ABSTRACT

An input/output interface circuit includes a common receiving driver configured to receive a differential clock signal and output a first clock signal corresponding to the differential clock signal and a pair of sub-channels connected to the common receiving driver. Each sub-channel of the pair of sub-channels may be configured to receive the first clock signal and a chip select signal, output a second clock signal through a logical AND operation of the first clock signal and the chip select signal, and output a single clock signal, among the second clock signal and one or more divided clock signals. The single clock signal is used to sample a command address signal.

20 Claims, 9 Drawing Sheets

(51) Int. Cl.

| | |
|---|---|
| *G11C 7/10* | (2006.01) |
| *G11C 7/22* | (2006.01) |
| *G11C 8/12* | (2006.01) |

(56) References Cited

U.S. PATENT DOCUMENTS

| | | | | |
|---|---|---|---|---|
| 11,031,049 | B2 | 6/2021 | Jeddeloh et al. | |
| 11,468,931 | B2 | 10/2022 | Leslie et al. | |
| 2010/0085084 | A1 * | 4/2010 | Kim | G09G 3/3648 327/108 |
| 2019/0371374 | A1 | 12/2019 | Uemura et al. | |
| 2020/0219546 | A1 | 7/2020 | Lee et al. | |
| 2021/0174853 | A1 | 6/2021 | Lee | |
| 2021/0216238 | A1 | 7/2021 | Nale et al. | |
| 2022/0069825 | A1 * | 3/2022 | Kim | H03K 21/10 |
| 2023/0081627 | A1 * | 3/2023 | Li | G11C 7/1009 |
| 2023/0170037 | A1 | 6/2023 | Suh | |
| 2023/0215493 | A1 | 7/2023 | Galbi et al. | |

* cited by examiner

INPUT/OUTPUT INTERFACE CIRCUIT AND MEMORY SYSTEM INCLUDING THE SAME

CROSS-REFERENCE TO RELATED APPLICATION(S)

This application claims priority under 35 USC § 119 to Korean Patent Application Nos. 10-2023-0153033, filed on Nov. 7, 2023, and 10-2024-0022952, filed on Feb. 16, 2024, in the Korean Intellectual Property Office, the disclosures of which are herein incorporated by reference in their entirety.

BACKGROUND

Example embodiments relate to an input/output interface circuit and a memory system including the same.

Mobile communication devices are becoming increasingly commonplace and are evolving to provide enhanced user experiences. Applications and data for numerous functions of mobile communication devices are stored in a memory. Accordingly, there is an increasing demand for memory that consumes less power. In general, clock signals for memory operation are separately provided for each sub-channel. For this reason, interface elements for transmission and reception of clock signals are also provided for each sub-channel.

SUMMARY

Example embodiments provide an input/output interface circuit for dividing a common clock signal for each sub-channel and a memory system including the same.

Provided herein is an input/output interface circuit including: a common receiving driver configured to receive a differential clock signal and output a first clock signal corresponding to the differential clock signal; and a pair of sub-channels connected to the common receiving driver, wherein: each sub-channel of the pair of sub-channels is configured to receive the first clock signal, a chip select signal, a second clock signal, a logical AND operation, a single clock signal, one or more divided clock signals, and a command address signal are separately defined for each sub-channel, each sub-channel is configured to receive the chip select signal, each sub-channel is configured to output the second clock signal through the logical AND operation of the first clock signal and the chip select signal to provide the single clock signal, wherein the single clock signal is provided from among: i) the second clock signal and ii) the one or more divided clock signals, wherein the one or more divided clock signals are divided from the second clock signal, and the single clock signal is configured to sample the command address signal.

Also provided herein is an input/output interface circuit including: a common receiving driver configured to receive a differential clock signal and output a first clock signal corresponding to the differential clock signal; and a first sub-channel and a second sub-channel connected to the common receiving driver, wherein: the first sub-channel is configured to receive the first clock signal and a first chip select signal, output a 2-1-th clock signal through a first logical AND operation of the first clock signal and the first chip select signal, output a first single clock signal provided from among: I) the 2-1-th block signal and ii) one or more first divided clock signals, wherein the one or more first divided clock signals are divided from the 2-1-th clock signal, and sample a first command address signal using the first single clock signal, and the second sub-channel is configured to receive the first clock signal and a second chip select signal, output a 2-2-th clock signal through a second logical AND operation of the first clock signal and the second chip select signal, and output a second single clock signal provided from among: I) the 2-2-th block signal and ii) one or more second divided clock signals, wherein the one or more first divided clock signals are divided from the 2-2-th block signal, and sample a second command address signal using the second single clock signal.

Also provided herein is a memory system including: a system-on-chip (SoC) including a first input/output interface circuit; and a memory device including a second input/output interface circuit communicating with the first input/output interface circuit, wherein the second input/output interface circuit includes: a common receiving driver configured to receive a differential clock signal through the first input/output interface circuit and output a first clock signal corresponding to the differential clock signal; and a pair of sub-channels connected to the common receiving driver, and each sub-channel of the pair of sub-channels is configured to receive the first clock signal through the common receiving driver, a chip select signal, a second clock signal, a logical AND operation, a single clock signal, one or more divided clock signals, and a command address signal are separately defined for each sub-channel, each sub-channel is configured to receive the chip select signal, each sub-channel is configured to output the second clock signal through the logical AND operation of the first clock signal and the chip select signal to provide the single clock signal, wherein the single clock signal is provided from among: i) the second clock signal and ii) the one or more divided clock signals, wherein the one or more divided clock signals are divided from the second clock signal, and the single clock signal is configured to sample the command address signal.

DETAILED DESCRIPTION

Hereinafter, example embodiments will be described with reference to the accompanying drawings.

Figure 1:
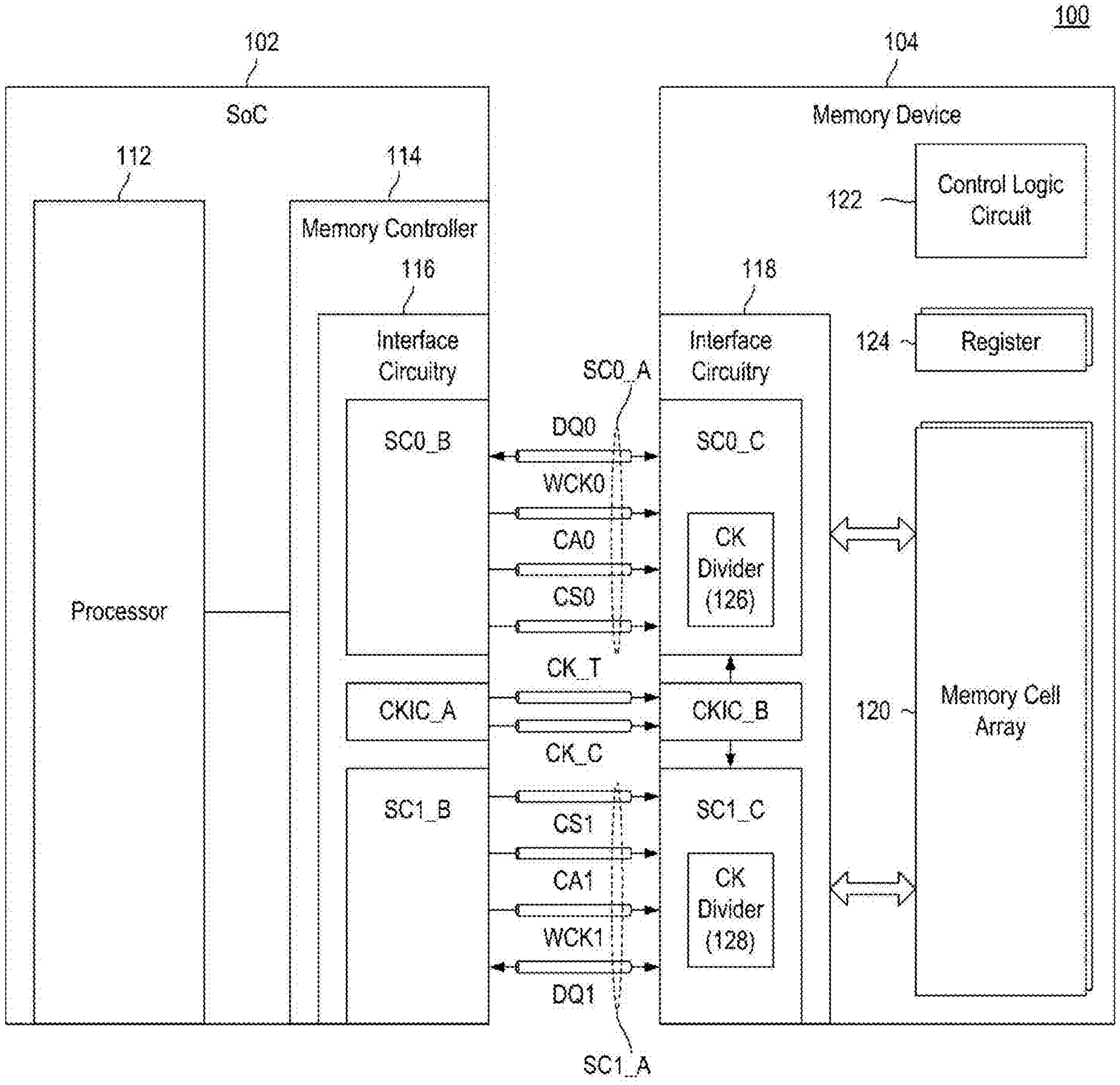
FIG. 1 is a diagram illustrating a memory system according to example embodiments.

FIG. 1 is a diagram illustrating a memory system according to example embodiments.

Referring to FIG. 1, a memory system 100 according to example embodiments may include a system-on-chip (SoC)

102 and a memory device 104. As an application processor (AP), the SoC 102 may control the overall operation of the memory device 104. The SoC 102 may include a processor 112 and a memory controller 114.

The processor 112 is a processing unit of a computing system for executing operating systems, applications, or the like, and may be regarded as a host in terms of the memory device 104. For example, the processor 112 may be implemented as a general-purpose processor, a specific-purpose processor, an AP, or the like. For example, the processor 112 may be implemented as an operation processor (for example, a central processing unit (CPU), a graphics processing unit (GPU), an application processor (AP), or the like) including a specific-purpose logic circuit (for example, a field programmable gate array (FPGA), an application specific integrated circuit (ASIC), or the like), but example embodiments are not limited thereto.

The memory controller 114 may generate an access command for the memory device 104 in response to operations executed by the processor 112. The memory controller 114 may access the memory device 104 through the access command. The memory controller 114 may be connected to the memory device 104 through a plurality of channels including buses or signal lines. According to example embodiments, the memory controller 114 may be connected to the memory device 104 through a plurality of channels including a pair of sub-channels, and may transmit and receive data, commands, and addresses through the channels. A control operation of the memory controller 114 on the memory device 104 may be performed independently for each channel.

According to example embodiments, the memory controller 114 may manage both the pair of sub-channels as illustrated in the drawing, or a unit memory controller may be provided for a single sub-channel. For example, the memory controller 114 may be provided as a portion of the processor 112, and a logic for generating an access command of the memory controller 114 may be implemented on the same die or package space as the processor 112.

According to example embodiments, the memory controller 114 may include a first input/output interface circuit 116. The memory device 104 may include a second input/output interface circuit 118 corresponding to the first input/output interface circuit 116. The first input/output interface circuit 116 may include a pair of sub-channels and a clock interface circuit. The term "sub-channel" may be defined as a sub-channel included in each interface circuit and a sub-channel connected between input/output interface circuits. For ease of description, a sub-channel connected between input/output interface circuits will be defined as a sub-channel A, a pair of sub-channels included in the first input/output interface circuit 116 will be defined as a sub-channel B, and a pair of sub-channels included in the second input/output interface circuit 118 will be defined as a sub-channel C.

The input/output interface circuits 116 and 118 may include hardware or combinations thereof for connecting pins, pads, connectors, signal lines, wires, or other devices. The input/output interface circuits 116 and 118 may include one or more transmission drivers and receiving drivers (or transceivers) for each signal line.

According to example embodiments, the input/output interface circuits 116 and 118 may connect the memory controller 114 and the memory device 104 through signal lines. For example, the signal lines may include lines through which differential clock signals CK_T and CK_C are transmitted, lines through which command and address signals CA0 and CA1 are transmitted, lines through which write data DQ0 and read data DQ1 are transmitted, lines through which chip select signals CS0 and CS1 are transmitted, and other signal lines. Each of the lines may also be referred to as a bus. Among the signal lines, the lines through which the first data signal DQ0, the first write clock signal WCK0, the first command address signal CA0, and the first chip select signal CS0 are transmitted may be defined as a first sub-channel A SC0_A. The lines through which the second data signal DQ1, the second write clock signal WCK1, the second command address signal CA1, and the second chip select signal CS1 are transmitted may be defined as a second sub-channel A SC1_A.

Through each sub-channel A, data signals may be transmitted or received between the first input/output interface circuit 116 and the second input/output interface circuit 118, or the write clock signals WCK0 and WCK1, the command address signals CA0 and CA1, and the chip select signals CS0 and CS1 may be transmitted from the first input/output interface circuit 116 to the second input/output interface circuit 118.

The first input/output interface circuit 116 may include a pair of sub-channels (a first sub-channel B (SC0_B) and a second sub-channel B (SC1_B)) and a first clock interface circuit CKIC_A. The first sub-channel B (SC0_B) and the second sub-channel B (SC1_B) may be connected to a sub-channel on the side of the memory device 104 to transmit or receive the above-mentioned signals. The first clock interface circuit CKIC_A may be connected to the second clock interface circuit CKIC_B on the side of the memory device 104 to transmit the differential clock signals CK_T and CK_C to be commonly applied to the first sub-channel C (SC0_C) and the second sub-channel C (SC1_C) included in the memory device 104. According to example embodiments, the second clock interface circuit CKIC_B may include a common receiving driver and the first clock interface circuit CKIC_A may include a transmission driver corresponding to the common receiving driver.

The memory device 104 may be connected to the SoC 102 through a pair of sub-channels A and a differential clock signal line. The memory device 104 may be compatible with a general-purpose DRAM technology or standard such as a double data rate synchronous dynamic random access memory (DDR SDRAM), DDR2 SDRAM, DDR3 SDRAM, DDR4 SDRAM, or DDR5 SDRAM, a DRAM technology or standard for mobile application, such as a low power double data rate (LPDDR) SDRAM, LPDDR2 SDRAM, LPDDR3 SDRAM, LPDDR4 SDRAM, LPDDR4X SDRAM, LPDDR5 SDRAM, or LPDDR6 SDRAM, a DRAM technology or standard for providing high bandwidth, such as a graphics double data rate (GDDR) synchronous graphics random access memory (SGRAM), GDDR2 SGRAM, GDDR3 SGRAM, GDDR4 SGRAM, GDDR5 SGRAM, GDDR6 SGRAM, a high-bandwidth memory (HBM), HBM2, HBM3, or WideIO, or combinations of at least a portion thereof, or may be implemented based on the above-mentioned technologies or standards.

The memory device 104 may include a second input/output interface circuit 118, a plurality of memory cell arrays 120, a control logic circuit 122, and a plurality of registers 124.

The second input/output interface circuit 118 may be connected to the first input/output interface circuit 116 through the sub-channels A (SC0_A and SC1_A) and may include a pair of sub-channels (the first sub-channel C (SC0_C) and the second sub-channel C (SC1_C)) and a second clock interface circuit CKIC_B. The second clock interface circuit CKIC_B may convert the differential clock signals CK_T and CK_C, received from the memory controller 114, into common clock signals and transmit the common clock signals to the first sub-channel C (SC0_C) and the second sub-channel C (SC1_C). For example, each sub-channel may use the common clock signal.

The first sub-channel C (SC0_C) may include a clock divider 126, and the second sub-channel C (SC1_C) may include a clock divider 128. The clock dividers 126 and 128 may generate one or more divided clock signals divided from a clock signal common to sub-channels. Each divided clock signal may have a frequency required by each sub-channel. For example, the first sub-channel C (SC0_C) and the second sub-channel C (SC1_C) may receive a common clock signal from the second clock interface circuit CKIC_B, but may operate independently with different operating speeds by converting a frequency of the common clock signal into the frequency required by each sub-channel and using the converted frequency, through the clock dividers 126 and 128.

For example, when a relatively high-performance operation is required in the first sub-channel and a low-power operation is required in the second sub-channel, the first clock divider 126 may operate at the external CK input speed rather than dividing the common clock signal, and the second clock divider 128 may divide the common clock signal into a low frequency compared to the frequency required in the first sub-channel.

The plurality of memory cell arrays 120 may be accessed by each sub-channel (for example, the first sub-channel or the second sub-channel).

The control logic circuit 122 may include control logic to control an internal operation of the memory device 104. For example, the control logic circuit 122 may generate an internal operation to decode and execute a command transmitted by the memory controller 114. The control logic circuit 122 may determine which mode is selected, based on programmed setting or default setting represented by the registers 124, and may execute an operation depending on the mode.

The register 124 may be a storage device providing a configuration or setting for the memory device 104. The register 124 may be provided in singular or plural. For example, the registers 124 may include one or more mode registers. The mode register may set an operating mode of the memory device 104. According to example embodiments, the mode register may control the first sub-channel C (SC0_C) and the second sub-channel C (SC1_C) through a mode register write signal.

According to the above-described embodiments, the memory system 100 may have a structure, in which an input/output interface circuit included in the memory device 104 may distribute a clock signal, common to each sub-channel, to a sub-channel, and a structure in which a clock signal common to each sub-channel may be independently divided. Therefore, each sub-channel may operate with an independent frequency and operating speed even in a structure in which a clock signal is common.

Figure 2:
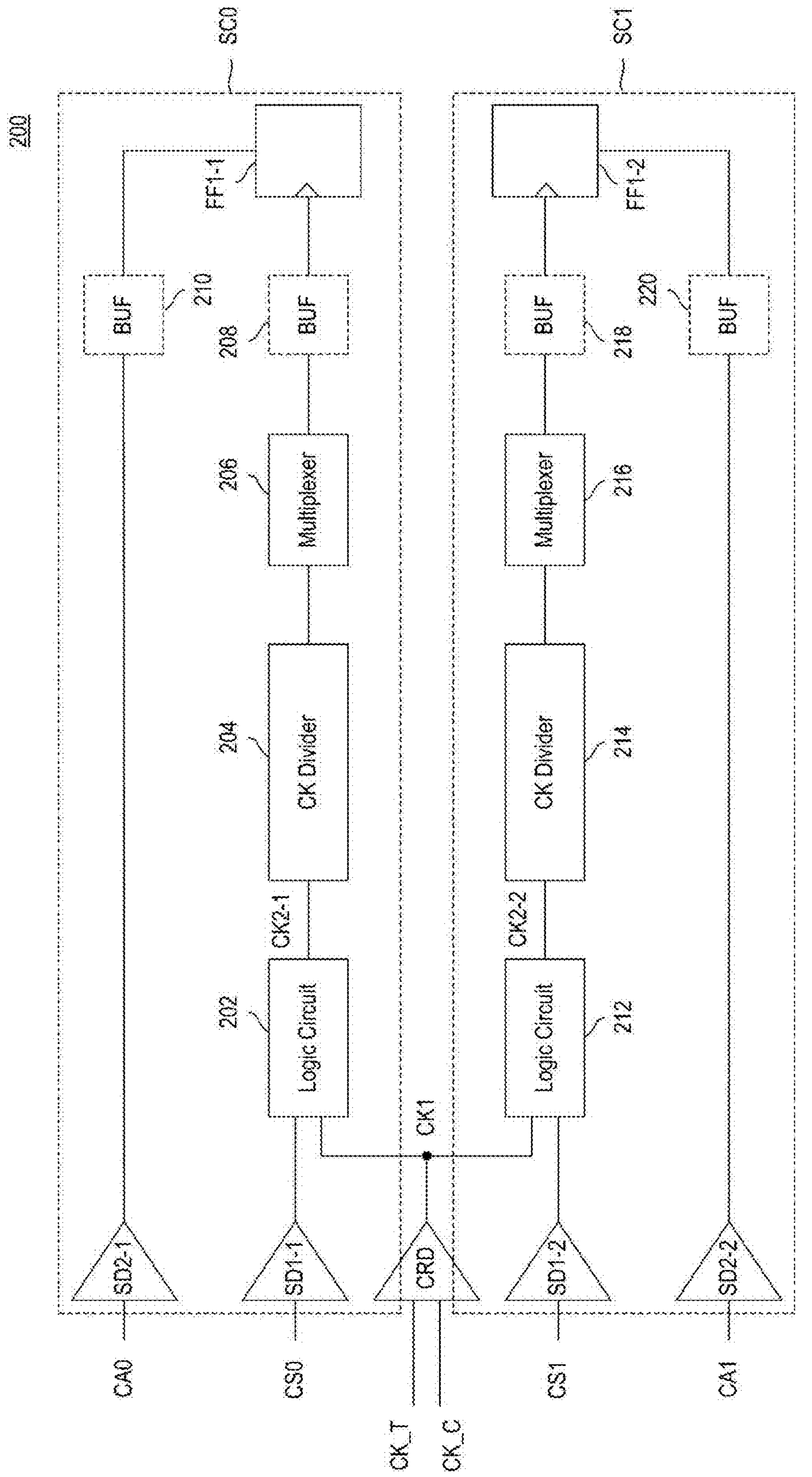
FIG. 2 is a diagram illustrating an input/output interface circuit according to example embodiments.

FIG. 2 is a diagram illustrating an input/output interface circuit according to example embodiments.

Referring to FIG. 2, an input/output interface circuit according to example embodiments (for example, the second input/output interface circuit of FIG. 1) may include a common receiving driver CRD and a pair of sub-channels SC0 and SC1. A driver is, in general, an electronic amplifier circuit. The common receiving driver CRD may receive differential clock signals CK_T and CK_C from the first clock interface circuit included in the first input/output interface circuit of FIG. 1. For example, the common receiving driver CRD may correspond to the second clock interface circuit of FIG. 1. The common receiving driver CRD may output a first clock signal CK1 corresponding to the differential clock signals CK_T and CK_C.

The pair of sub-channels SC0 and SC1 may be connected to the common receiving driver CRD. According to example embodiments, the pair of sub-channels SC0 and SC1 may each be configured to receive a first clock signal CK1 and chip select signals CS0 and CS1, output a second clock signal from a logical operation of the first clock signal CK1 and the chip select signals CS0 and CS1, and output a single clock signal, among a second clock signal and one or more divided clock signals divided from the second clock signal. The pair of sub-channels SC0 and SC1 may sample command address signals CA0 and CA1 based on the output single clock signal.

Except for the first clock signal CK1, each signal may be defined for each sub-channel. For example, the first chip select signal CS0, a 2-1-th clock signal CK2-1, and the first command address signal CA0 may be defined for the first sub-channel SC0, and the second chip select signal CS1, a 2-2-th clock signal CK2-2, and the second command address signal CA1 may be defined for the second sub-channel SC1.

According to example embodiments, the sub-channel SC0 may include a plurality of sub-channel drivers, a logic circuit 202, a clock divider 204, a multiplexer 206, a plurality of buffers 208 and 210, and a flip-flop FF1-1. A buffer may be implemented using logic gates. The sub-channel SC1 may include a plurality of sub-channel drivers, a logic circuit 212, a clock divider 214, a multiplexer 216, a plurality of buffers 218 and 220, and a flip-flop FF1-2. The plurality of sub-channel drivers may include first sub-channel drivers SD1-1 and SD1-2, respectively receiving chip select signals CS0 and CS1, and second sub-channel drivers SD2-1 and SD2-2, respectively receiving command address signals CA0 and CA1. An input terminal of each sub-channel driver may be connected to a signal line of FIG. 1, configured to transmit a corresponding signal, to receive the corresponding signal. Unlike the common receiving driver CRD, a plurality of sub-channel drivers may be provided for each sub-channel, and may receive signals (the chip select signals CS0 and CS1, the command address signals CA0 and CA1, or the like) defined independently for each sub-channel.

The logic circuits 202 and 212 may be connected to an output terminal of the common receiving driver CRD and output terminals of a plurality of sub-channel drivers. The logic circuit 202 and 212 may perform a logical operation on the first clock signal CK1 and the chip select signals CS0 and CS1. The logical operation may be defined as an operation of sampling the first clock signal CK1 depending on whether the chip select signals CS0 and CS1 are activated (or logic high (or logic low)). For example, the logical operation may be an AND operation, in which each of the logic circuits 202 and 212 may be implemented as an AND gate. As described above, it will be understood that when the first clock signal CK1 may be sampled based on the chip select signals CS0 and CS1, each of the logic circuits 202 and 212 may also be implemented as a logic gate to perform operations (for example, an NAND operation, or the like) other than the AND operation. Hereinafter, a clock signal processed by the logical operation through the logic circuits 202 and 212 may be defined as a second clock signal. The second clock signal may be defined as the 2-1-th clock signal CK2-1 for the first sub-channel SC0 and as the 2-2-th clock signal CK2-2 for the second sub-channel SC1.

The multiplexers 206 and 216 may select a single clock signal from among a second clock signal and one or more divided clock signals, based on a control signal. The first multiplexer 206 may be provided for the first sub-channel SC0, and the second multiplexer 216 may be provided for the second sub-channel SC1. According to example embodiments, the control signal may be a mode register write signal. For example, the mode register write signal may be provided from the register described above in FIG. 1.

The multiplexer 206 and 216 may select a clock signal corresponding to a frequency required by each sub-channel based on the control signal. The undivided second clock signal may be selected through the multiplexers 206 and 216 or a divided clock signal may be selected, depending on the operating mode. The clock dividers 204 and 214 and the multiplexers 206 and 216 are independently provided for each sub-channel, so that sub-channel may operate at different frequencies through the multiplexers 206 and 216, respectively. For example, when a high-performance operation is required for the first sub-channel SC0, the first multiplexers 206 and 216 may select a clock signal corresponding to a higher frequency. In addition, when a lower-power operation is required for the second sub-channel SC1, the second multiplexers 206 and 216 may select a clock signal corresponding to a lower frequency.

As a result, the multiplexers 206 and 216 may select a single clock signal from among a plurality of clock signals (a basic clock signal and divided clock signals) generated from the clock dividers 204 and 214, to adjust a division factor 2N through the control signal.

Each sub-channel may include first buffers 208 and 218, connected between the multiplexers 206 and 216 and the flip-flops FF1-1 and FF1-2, and second buffers 210 and 220 connected between the second sub-channel drivers SD2-1 and SD2-2 and the flip-flops FF1-1 and FF1-2. A 1-1-th buffer 208 and a 2-1-th buffer 210 may be provided for the first sub-channel SC0, and a 2-1-th buffer 218 and a 2-2-th buffer 220 may be provided for the second sub-channel SC1. The first buffers 208 and 218 may buffer a single clock signal selected from the multiplexers 206 and 216, and transmit the buffered clock signal to clock gates of the flip-flops FF1-1 and FF1-2. The second buffers 210 and 220 may buffer the command address signals CA0 and CA1, and transmit the buffered common address signals CA0 and CA1 to the flip-flops FF1-1 and FF1-2. According to example embodiments, the first buffers 208 and 218 and the second buffer 210 and 220 may each be additionally provided in plural, or may be omitted.

The flip-flops FF1-1 and FF1-2 may store the command address signals CA0 and CA1 based on a single clock signal. The flip-flops FF1-1 and FF1-2 may store and output the command address signals CA0 and CA1 in synchronization with the single clock signal selected from the multiplexers 206 and 216. Unlike what is illustrated, the flip-flops FF1-1 and FF1-2 may be replaced with other storage elements that may perform a storage operation (or a delay operation) based on a clock signal.

According to the above-described embodiments, the input/output interface circuit may have a structure in which each sub-channel receives common differential clock signals CK_T and CK_C, but may independently divide and select the first clock signal CK1 corresponding to the differential clock signals CK_T and CK_C. Therefore, each sub-channel may be independently driven even when the clock signal is merged.

Figure 3:
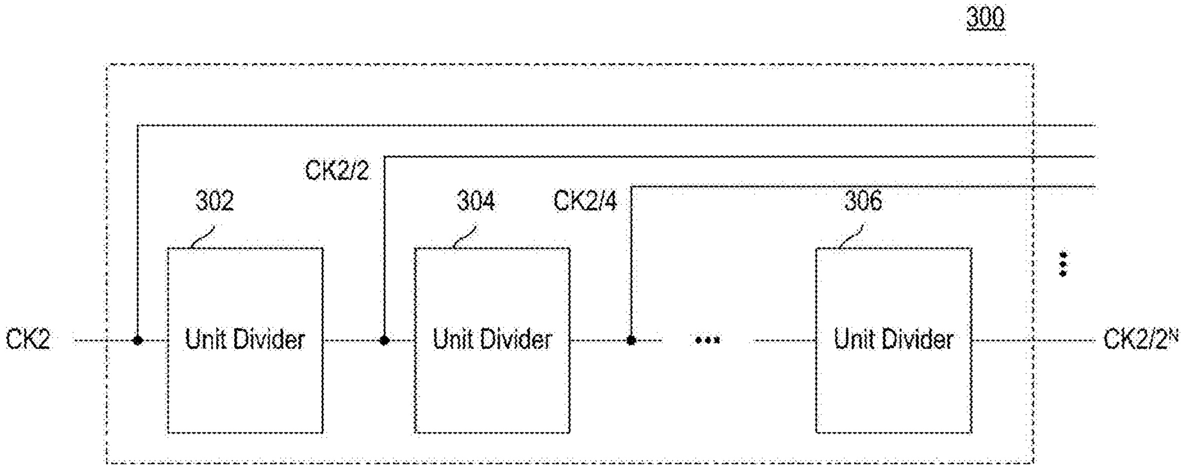
FIG. 3 is a diagram illustrating a clock divider according to example embodiments.

FIG. 3 is a diagram illustrating a clock divider according to example embodiments.

Referring to FIG. 3, a clock divider according to example embodiments may include one or more unit dividers 302, 304, and 306. The one or more unit dividers 302, 304, and 306 may be sequentially connected from an output of a logic circuit (for example, an AND gate). For example, the unit dividers may include N unit dividers.

Each unit divider may divide the clock signal such that the divided clock signal has a lower frequency than a divided clock signal output from a unit divider disposed at a previous end. For example, the first unit divider 302 may receive a second clock signal CK2 and output a clock signal CK2/2 divided by 2, and a second unit divider 304 connected to a first unit divider 302 may output a clock signal CK2/4 divided by 4 from the clock signal CK2/2 divided by 2. An Nth unit divider 306, disposed at a last terminal, may output a clock signal CK2/2N divided by $2^N$. According to the above-described embodiments, when a plurality of unit dividers is provided, a clock divider may provide a wider range of frequencies.

Figure 4:
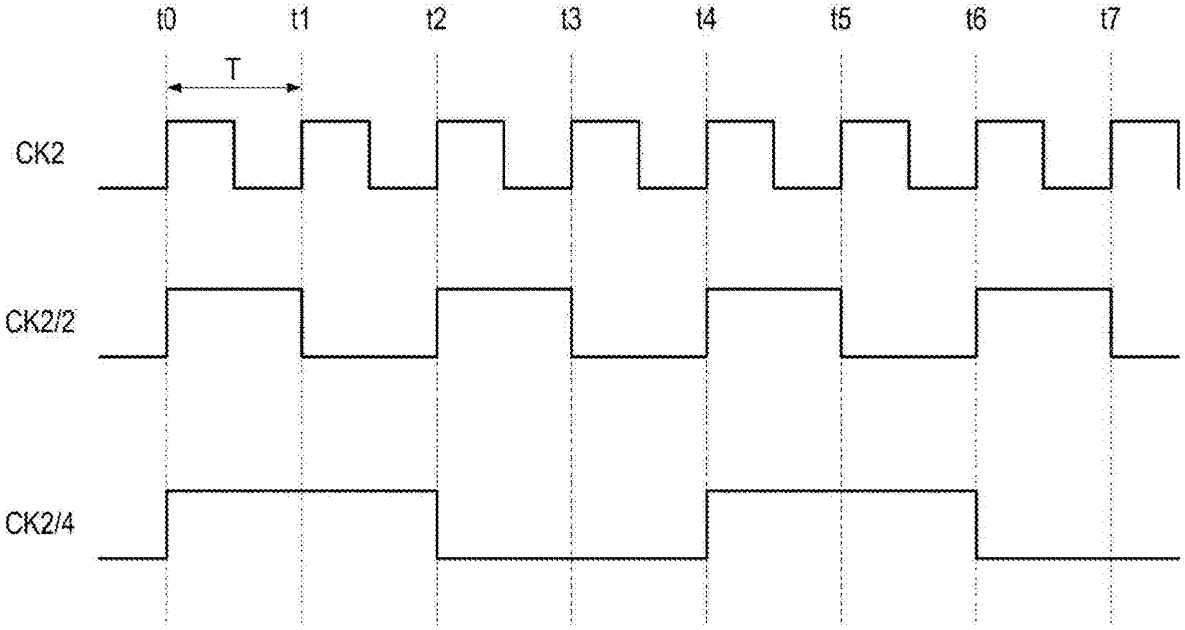
FIG. 4 is a timing diagram of divided clock signals for each unit divider of FIG. 3 according to example embodiments.

FIG. 4 is a timing diagram of divided clock signals for each unit divider of FIG. 3 according to example embodiments.

Referring to FIG. 4, when a period of the second clock signal CK2 is T (where T is a real number greater than 0), a period of the clock signal CK2/2 divided by 2 is 2T and a period of the clock signal CK2/4 divided by 4 is 4T. Time instances are marked at the top of FIG. 4 as t0, t1, . . . , t7. The time between time instances is T. The higher the performance required for a sub-channel, the higher the frequency of a divided clock signal that is selected. In addition, the lower the performance required for a sub-channel, the lower the frequency of a divided clock signal that is selected.

Figure 5:
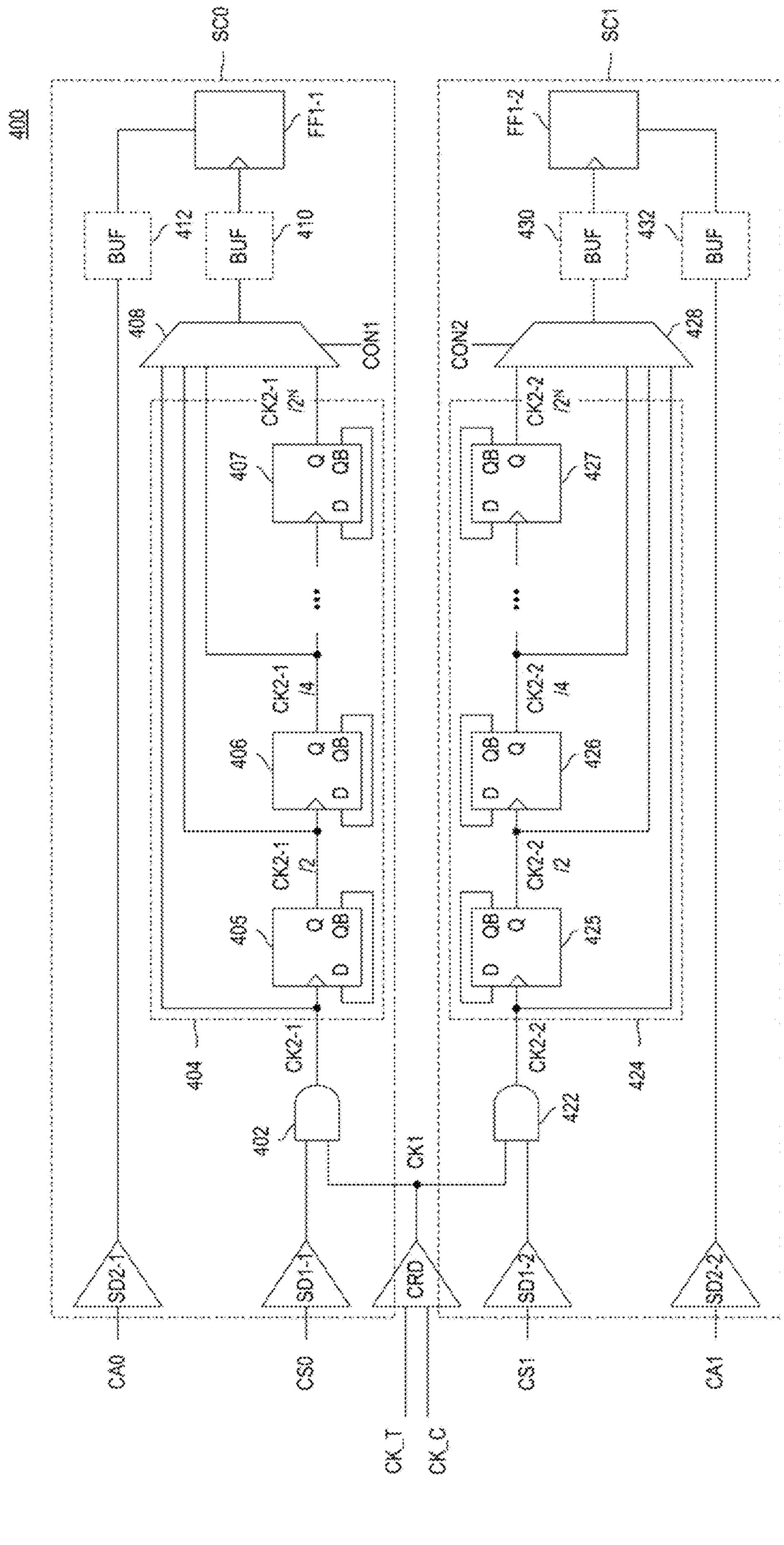
FIG. 5 is a diagram illustrating an example of the input/output interface circuit of FIG. 3.

FIG. 5 is a diagram illustrating an example of the input/output interface circuit of FIG. 3.

Referring to FIG. 5, the input/output interface circuit 400 according to example embodiments may receive differential clock signals CK_T and CK_C through the common receiving driver CRD and divide and use the first clock signal CK1 for each pair of sub-channels.

In the first sub-channel SC0, the first chip selects signal CS0 and the first clock signal CK1 received through the first-1 sub-channel driver SD1-1 may be input to the first AND gate 402. The first AND gate 402 may output the 2-1-th clock signal CK2-1 through a logical AND operation. The 2-1-th clock signal CK2-1 may be input to the first clock divider 404.

The first clock divider 404 may include a plurality of first unit dividers 405 to 407. The plurality of first unit dividers 405 to 407 may be connected sequentially. As illustrated in the drawing, the plurality of first unit dividers 405 to 407 may be implemented as flip-flops (for example, D flip-flops). For example, each of the plurality of first unit dividers 405 to 407 may have a form in which an inverted output terminal QB is connected to an input terminal D. Accordingly, each unit divider may output a clock signal, divided by 2, of a clock signal applied to a clock gate to an output terminal Q.

For example, the 1-1-th unit divider 405 may receive a 2-1-th clock signal CK2-1 through a clock gate and output a clock signal CK2-1/2, divided by 2, of the 2-1-th clock signal CK2-1, the 1-2-th unit divider 406 may receive the clock signal CK2-1/2, divided by 2, through the clock gate and output a clock signal CK2-1/4 divided by 4, and the 1-N-th unit divider 407 may output a clock signal CK2-1/2N divided by N.

The first multiplexer 408 may receive a first divided clock signal output from each first unit divider and output a single clock signal based on a first control signal CON1. For example, the first control signal CON1 may be a mode register write signal. The single clock signal selected by the first multiplexer 408 may be applied to a clock gate of a 1-1-th flip-flop FF1-1 through a 1-1-th buffer 410. The 1-1-th flip-flop FF1-1 may sample the first command address signal CA0 transmitted through a 2-1-th sub-channel driver SD2-1 and a 2-1-th buffer 412.

The second sub-channel SC1 may have the same configuration as the first sub-channel SC0. For example, in the second sub-channel SC1, the second chip select signal CS1 and the first clock signal CK1 received through a 1-2-th sub-channel driver SD1-2 may be input to a second AND gate 422. The second AND gate 422 may output a 2-2-th clock signal CK2-2 through a logical AND operation.

The second clock divider 424 may include a plurality of second unit dividers 425 to 427. For example, a 2-1-th unit divider 425 may receive a 2-2-th clock signal CK2-2 through a clock gate and output a clock signal CK2-2/2, divided by 2, of the 2-2-th clock signal CK2-2, a 2-2-th unit divider 426 may receive the clock signal CK2-2/2, divided by 2, through the clock gate and output a clock signal CK2-2/4 divided by 4, and a 2-N-th unit divider 427 may output a clock signal CK2-2/2N divided by N.

The second multiplexer 428 may receive a second divided clock signal output from each second unit divider and output a single clock signal based on a second control signal CON2. The single clock signal selected by the second multiplexer 428 may be applied to a clock gate of a 1-2-th flip-flop FF1-2 through a 1-2-th buffer 430. The 1-2-th flip-flop FF1-2 may sample the second command address signal CA1 transmitted through a 2-2-th sub-channel driver SD2-2 and a 2-2-th buffer 432.

As the first chip select signal CS0 and the second chip select signal CS1 are logically ANDed with the first clock signal CK1, the clock divider may be turned on or off by a chip select signal. Therefore, the input/output interface circuit 400 may turn off a clock divider, which is not operating, through the chip select signal to reduce power consumption. In addition, the input/output interface circuit 400 may independently divide the common first clock signal CK1 into appropriate-frequency signals through a clock divider and a multiplexer provided for each sub-channel.

Figure 6:
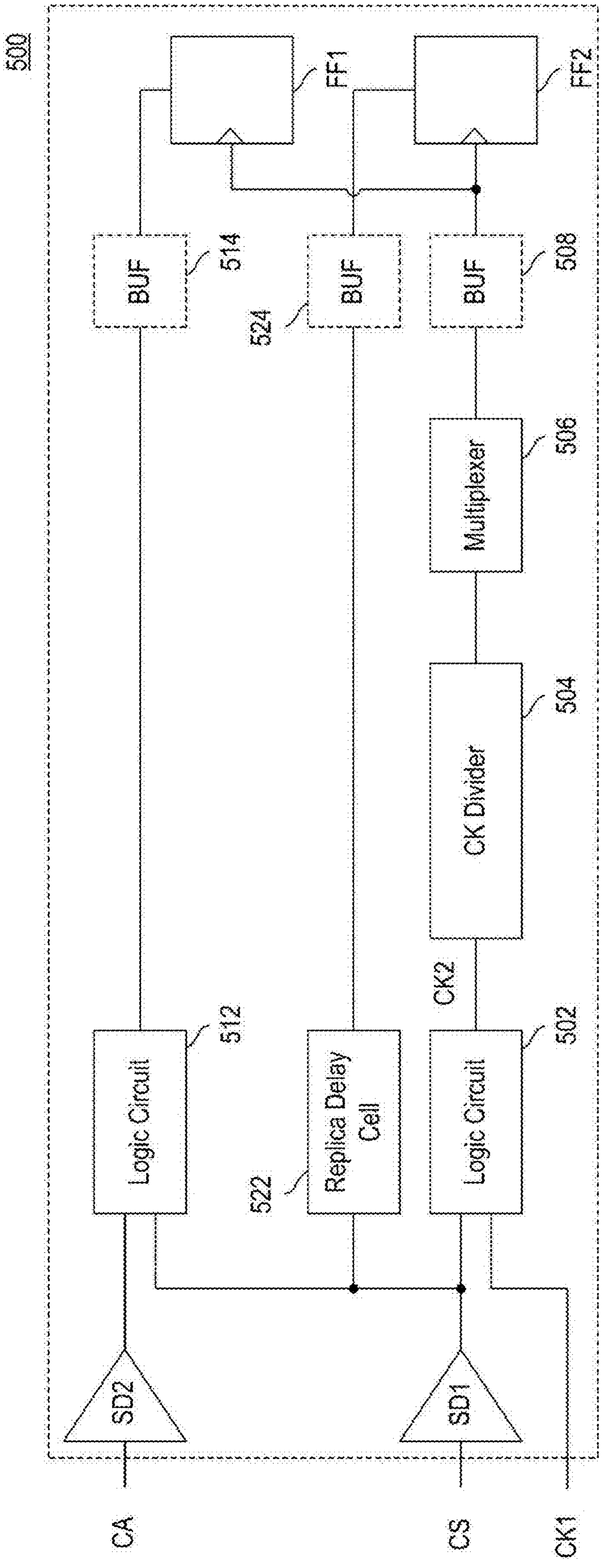
FIG. 6 is a diagram illustrating a sub-channel according to example embodiments.

FIG. 6 is a diagram illustrating a sub-channel according to example embodiments.

Referring to FIG. 6, a sub-channel 500 according to example embodiments may include a plurality of sub-channel drivers, a plurality of logic circuits 502 and 512, a clock divider 504, a multiplexer 506, a plurality of buffers 508, 514, and 524, and a plurality of flip-flops FF1 and FF2.

A first sub-channel driver SD1 may receive a chip select signal CS, and a second sub-channel driver SD2 may receive a command address signal CA. An output terminal of the first sub-channel driver SD1 may be connected to the first logic circuit 502, and the first logic circuit 502 may sample a first clock signal CK1 depending on whether the chip select signal CS is activated (or logic high (or logic low)) through a logical operation. A second clock signal CK2 may be output from a logic circuit and applied to the clock divider 504.

The clock divider 504 may generate one or more divided clock signals from the second clock signal CK2. The multiplexer 506 may select a single clock signal from among the second clock signal CK2 and one or more divided clock signals, and apply the selected clock signal to clock gates of the first flip-flop FF1 and the second flip-flop FF2.

The second sub-channel driver SD2 may receive the command address signal CA. The second logic circuit 512 may be connected to an output terminal of the second sub-channel driver SD2. The second logic circuit 512 may sample the command address signal CA signal depending on whether the chip select signal CS is activated (or logic high (or logic low)), similarly to the first logic circuit 502. For example, the second logic circuit 512 may be implemented as an AND gate that performs a logical AND operation, similarly to the first logic circuit 502.

An output terminal of the second logic circuit 512 may be connected to the first flip-flop FF1, and the first flip-flop FF1 may store the command address signal CA based on a single clock signal.

An output terminal of the first sub-channel driver SD1 may be connected to the second flip-flop FF2. The single clock signal selected by the multiplexer 506A may be applied to a clock gate of the second flip-flop FF2, and the second flip-flop FF2 may store the chip select signal CS based on the single clock signal. According to example embodiments, a replica delay cell 522 may be connected between the output terminal of the first sub-channel driver SD1 and the second flip-flop FF2. The replica delay cell 522 may be configured to add a delay to the chip select signal CS based on operations of the first logic circuit 502 and the second logic circuit 512 included in another path. A delay cell may be implemented using, for example, inverters and capacitors.

According to example embodiments, the sub-channel 500 may further include first to third buffer 508, 514, and 524 for signal buffering. The third buffer 524 may be connected between the replica delay cell 522 and the second flip-flop FF2 to buffer the chip select signal CS.

According to example embodiments, the configuration of the sub-channel of FIG. 6 may be equally applied to the first sub-channel SC0 and the second sub-channel SC1 according to the above-described embodiments.

According to the above-described embodiments, a sub-channel may sample the chip select signal CS and command address signal CA at an independent frequency using a divided clock signal from a clock signal common to each sub-channel.

Figure 7:
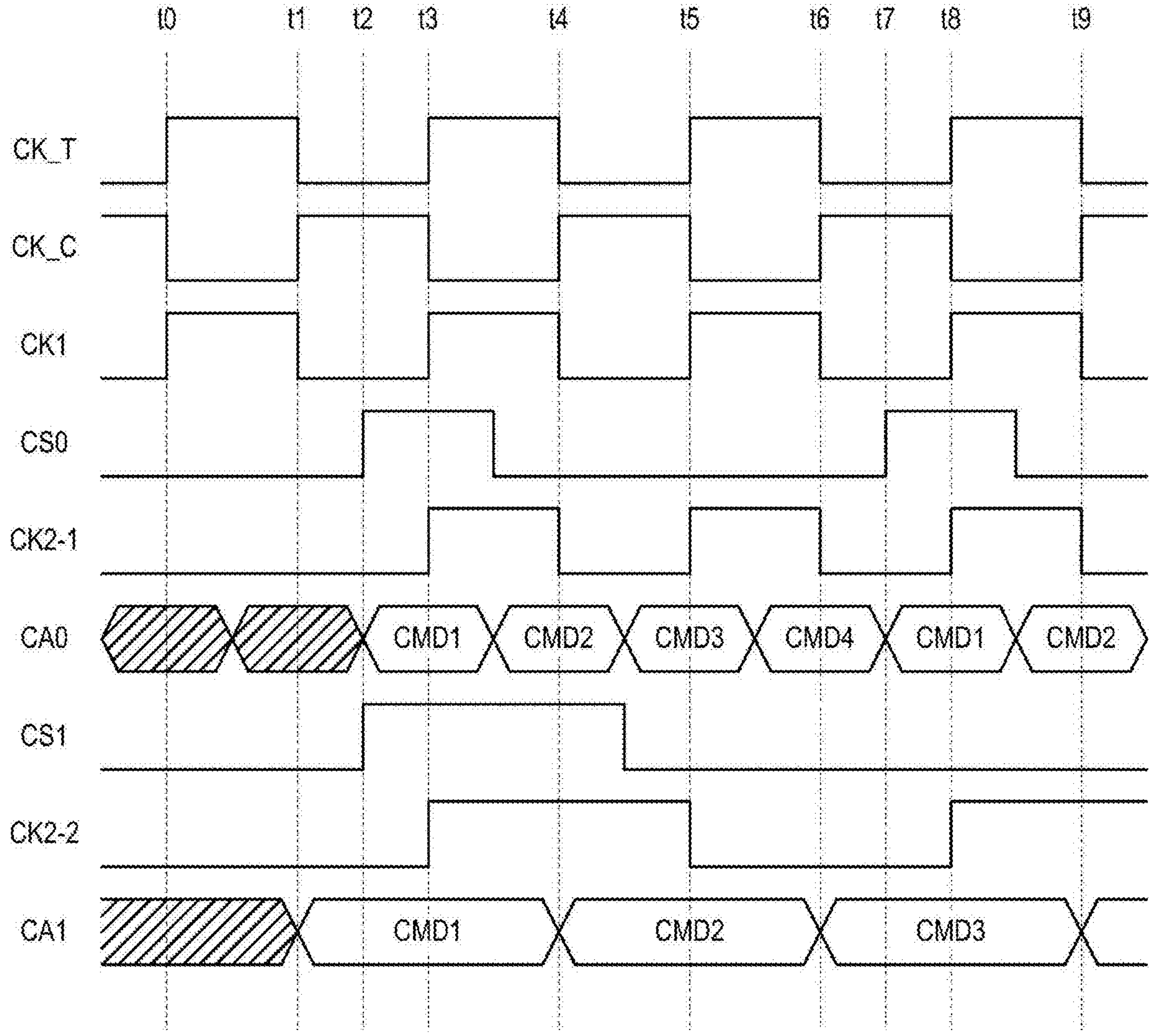
FIG. 7 is a timing diagram of signals of the input/output interface circuit of FIGS. 5 and 6.

FIG. 7 is a timing diagram of signals of the input/output interface circuit of FIGS. 5 and 6. In FIG. 7, an example is provided in which a 2-1-th clock signal CK2-1 is a clock signal, divided by 2, of a 2-2-th clock signal CK2-2. In addition, an example is provided in which a command address signal is sampled at a rising edge and a falling edge of each clock signal and is transmitted on four lines.

Referring to FIG. 7, differential clock signals CK_T and CK_C may have opposite phases. The first clock signal CK1 may have the same positive phase and frequency as the differential clock signals CK_T and CK_C. For example, a first chip select signal CS0 rises at times t2 and t7, and a second chip select signal CS1 rises at time t2. When the chip select signals CS0 and CS1 is logic high, the 2-1-th clock signal CK2-1 and the 2-2-th clock signal CK2-2 may be sampled through a logical operation. The 2-1-th clock signal CK2-1 has the same frequency as the first clock signal CK1, and may be sampled from time t3, at which the first clock signal CK1 rises, after time t2 at which the first chip select signal CS0 goes high. The 2-2-th clock signal CK2-2 may have a frequency obtained by dividing a frequency of the 2-1-th clock signal CK2-1 by 2, and may be sampled from time t3, at which the first clock signal CK1 rises, after time t2 at which the second chip select signal CS1 goes high. In addition, the second chip select signal CS1 may be sampled using a clock signal of the frequency divided by 2.

The 2-1-th clock signal CK2-1 may be used as a synchronization signal of a flip-flop (for example, the 1-1-th flip-flop of FIGS. 2 and 5) in which the first command address signal CA0 is stored, and the 2-2-th clock signal CK2-2 may be used as a synchronization signal of a flip-flop (for example, the 1-2-th flip-flop of FIGS. 2 and 5) in which the second command address signal CA1 is stored.

The first command address signal CA0 may be sampled at a rising edge and a falling edge of the 2-1-th clock signal CK2-1, so that the first to fourth commands CMD1 to CMD4 may be sampled from times t2 to t7.

As described above, the second command address signal CA1 is sampled at the rising edge and the falling edge of the 2-2-th clock signal CK2-2. Therefore, the second command address signal CA1 may represent first to fourth commands CMD1 to CMD4 sequentially from time t1. The second command address signal CA1 is sampled through a clock signal of frequency divided by 2 compared to the first command address signal CA0, so that the time length of a single command may be doubled.

Figure 8:
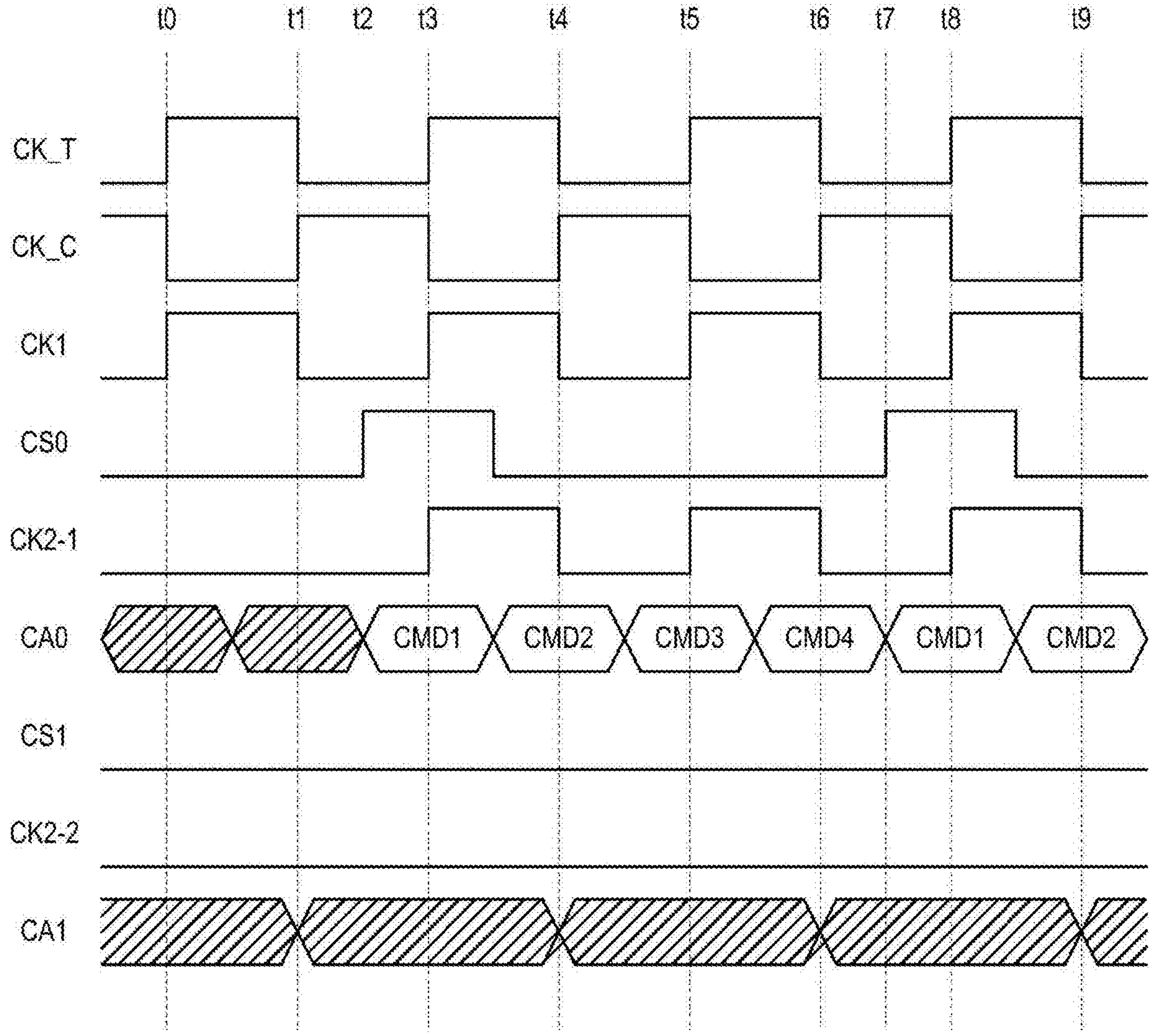
FIG. 8 is a timing diagram of signals depending on ON and OFF states of a sub-channel.

FIG. 8 is a timing diagram of signals depending on ON and OFF states of a sub-channel.

Referring to FIG. 8, an input/output interface circuit according to the above-described embodiments may turn off at least one of a pair of sub-channels based on a chip select signal. For example, in FIG. 8, an example is provided in which a second sub-channel is turned off. A first clock signal CK1, output from differential clock signals CK_T and CK_C through a common receiving driver CRD, may have the same positive phase and frequency as the differential clock signals CK_T and CK_C and may be applied to a sub-channel in the same manner.

A first chip select signal CS0 is at a high level in some periods, while the second chip select signal CS1 is at a low level in all periods. Therefore, all paths of a second sub-channel, including not only the second chip select signal CS1 but also a command address signal logically AND-ed with the second chip select signal CS1, may be turned off.

For example, similarly to FIG. 7, the first chip select signal CS0 corresponding to the first sub-channel may have a high level at a specific time point, and a 2-1-th clock signal CK2-1 and a first command address signal CA0 may be sampled based on the first chip select signal CS0.

However, the second chip select signal CS1 corresponding to the second sub-channel is at a low level in all periods, so that the 2-2 clock signal CK2-2 and the second command address signal CA1 cannot be sampled. Therefore, a toggling component of the second sub-channel is not provided, which may save power consumption for the memory system.

According to example embodiments, the first sub-channel may be turned off and the second sub-channel may be turned on, unlike what is illustrated. In addition, all sub-channels may be turned off.

Figure 9:
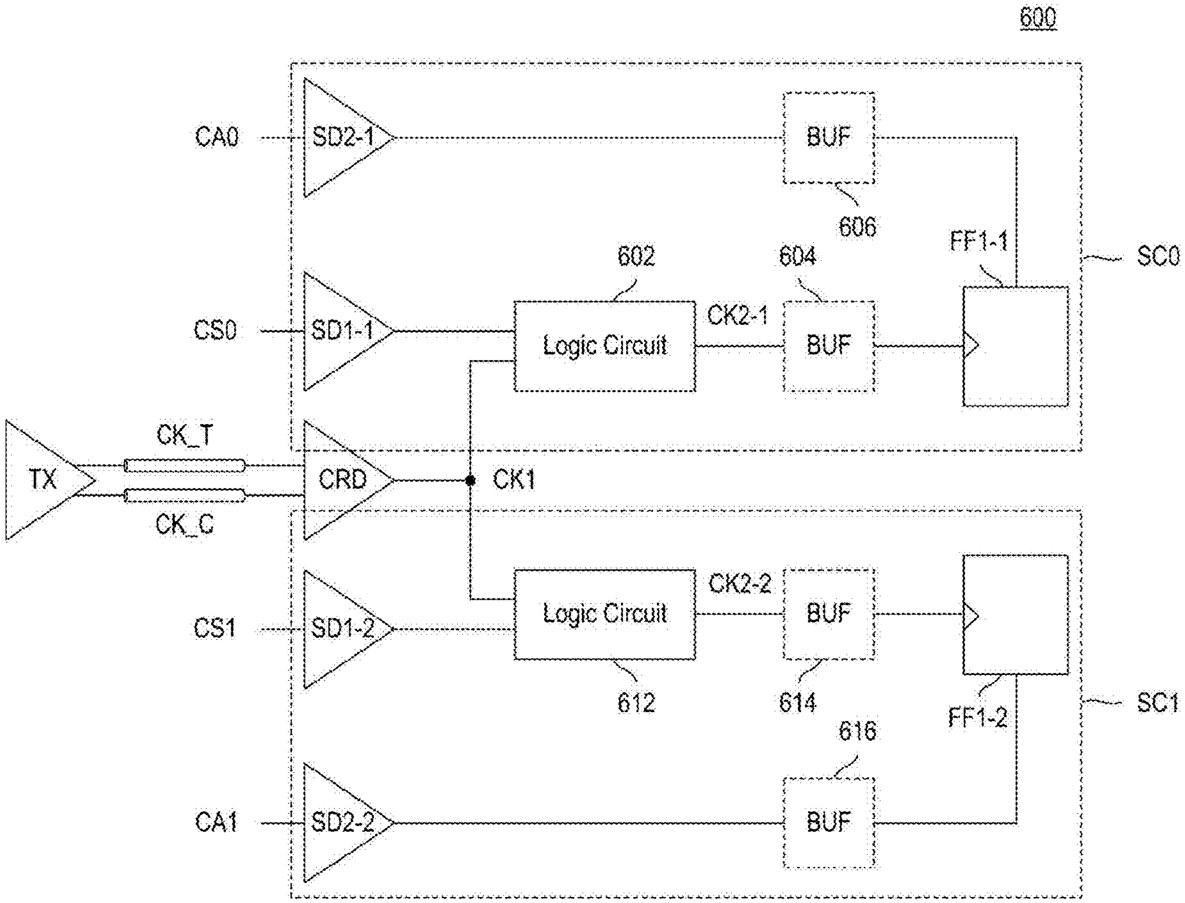
FIG. 9 is a diagram illustrating an input/output interface circuit according to example embodiments.

FIG. 9 is a diagram illustrating an input/output interface circuit according to example embodiments.

Referring to FIG. 9, an input/output interface circuit 600 according to example embodiments may be implemented by omitting the above-described clock divider and multiplexer. Similarly, to the above-described embodiments, each sub-channel may receive differential clock signals CK_T and CK_C through a common receiving driver CRD common to a sub-channel, and may use the received differential clock signals CK_T and CK_C for each sub-channel.

A 1-1-th logic circuit 602 may perform a logical operation a first chip select signal CS0 received through a 1-1-th sub-channel driver SD1-1 and a first clock signal CK1 output from the common receiving driver CRD and transmit a result of the logical operation to a 1-1-th flip-flop FF1-1. A 1-2-th logic circuit 612 may perform a logical operation on a second chip select signal CS1 received through a 1-2-th sub-channel driver SD1-2 and a first clock signal CK1 and transmit a result of the logical operation to a 1-2-th flip-flop FF1-2. For example, a chip select signal may be used to select each sub-channel.

The 1-1-th flip-flop FF1-1 may store a first command address signal CA0 based on a 2-1-th clock signal CK2-1 output from a 1-1-th logic circuit 602, and the 1-2-th flip-flop FF1-2 may store a second command address signal CA1 based on a 2-2-th clock signal CK2-2 output from a 1-2-th logic circuit 612. According to example embodiments, the plurality of buffers 604, 606, 614, and 616 described above may be included in a path between a clock gate and an input terminal of each flip-flop.

According to the above-described embodiments, in terms of sub-channel, the first clock signal CK1 may be divided for each sub-channel through a common receiving driver CRD common to a sub-channel, rather than providing an additional receiving driver to receive differential clock signals CK_T and CK_C. The input/output interface circuit 600 on a transmission side (for example, the first input/output interface circuit of FIG. 1) may include only one transmission driver corresponding to the common receiving driver CRD. For example, the number of transmission drivers on a host side and loading of a clock signal based thereon may be reduced. A path including the differential clock signals CK_T and CK_C and the first clock signal CK1 may always be turned on from an idle state of a memory system. Accordingly, there may be static power consumption proportional to a frequency of a clock signal. According to example embodiments, the number of drivers in the path may be reduced, and thus driving power of a memory system may be reduced. In addition, reducing the loading of the clock signal may result in improvement of signal integrity (SI) and allow the memory system to operate at higher speed.

In addition, any one sub-channel may be turned off depending on a chip select signal (for example, when a chip select signal applied to a logic circuit is at logic low), so that power consumption of an unused sub-channel may be significantly reduced.

In addition, the common receiving driver CRD may be implemented to reduce package pads caused by the driver. As a result, a chip area may be decreased.

Figure 10:
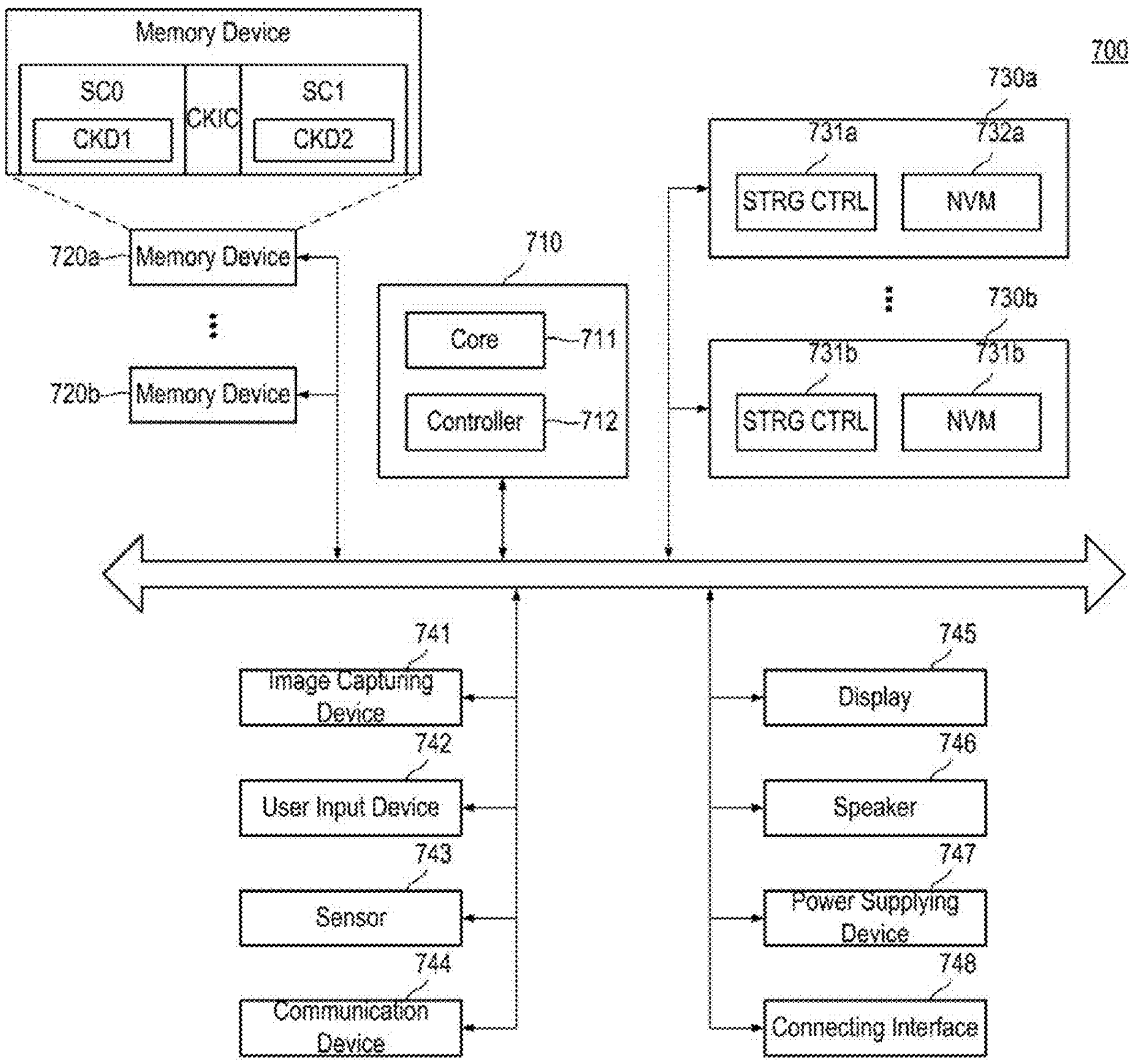
FIG. 10 is a diagram illustrating a system according to example embodiments.

FIG. 10 is a diagram illustrating a system according to example embodiments.

Referring to FIG. 10, a system 700 may be a mobile system such as a mobile phone, a smartphone, a tablet personal computer (PC), a wearable device, a healthcare device, or an Internet of Things (IoT) device. Alternatively, the system 700 may be a personal computer a laptop computer, a server, a media player, or an automotive device such as a navigation device, as well as the mobile system.

In an example embodiment, the system 700 may include a main processor 710, memories 720*a* to 720*b*, and storage devices 730*a* and 730*b*, and may further include at least one of an image capturing device 741, a user input device 742, a sensor 743, a communication device 744, a display 745, a speaker 746, a power supply device 747, and a connection interface 748.

The main processor 710 may control the overall operation of the system 700, for example, operations of other components included in the system 700. The main processor 710 may be implemented as a general-purpose processor, a specific-purpose processor, or an application processor.

The main processor 710 may include one or more cores 711, and may further include a controller 712 to control the memories 720*a* to 720*b* and/or the storage devices 730*a* and 730*b*. In an example embodiment, the main processor 710 may further include an accelerator, a specific-purpose circuit for high-speed data processing such as artificial intelligence (AI) data processing.

The memories 720*a* to 720*b* may be used as a main memory device of the system 700 and may include non-volatile memories such as a static random access memory (SRAM) and/or a dynamic random access memory (DRAM). The memories 720*a* to 720*b* may be implemented within the same package as the main processor 710. According to example embodiments, each of the memories 720*a* to 720*b* may include a first sub-channel SC0, a second sub-channel SC1, and a clock interface circuit CKIC according to the above-described embodiments (FIGS. 1 to 9). The first sub-channel SC0 may include a first clock divider CKD1, and the second sub-channel SC1 may include a second clock divider CKD2. Each clock divider may receive a common clock signal from the clock interface circuit CKIC and divide the received common clock signal depending on a frequency required for each sub-channel.

Each of the storage devices 730*a* and 730*b* may function as a nonvolatile storage device storing data regardless of whether power is supplied, and may have relatively large storage capacity compared to the memory. The storage devices 730*a* and 730*b* may include storage controllers 731*a* and 731*b* and nonvolatile memories (NVMs) 732*a* and 732*b* storing data under the control of the storage controllers 731*a* and 731*b*, respectively. The NVMs 732*a* and 732*b* may include a flash memory having a two-dimensional (2D) structure or a three-dimensional vertical NAND (3D V-NAND) structure, but may include other types of non-volatile memory such as a phase-change RAM (PRAM) and/or a resistive RAM (RRAM).

The storage devices 730*a* and 730*b* may be included in the system 700 while being physically separated from the main processor 710, or may be implemented in the same package as the main processor 710. In addition, each of the storage devices 730*a* and 730*b* may be in the form of a solid-state drive (SSD) or a memory card to be removably coupled to other components of the system 700 through an interface such as a connection interface 748 to be described later. Each of the storage devices 730*a* and 730*b* may be a device to which the standard protocol is applied, such as such as a universal flash storage (UFS), an embedded multimedia card (eMMC), or a nonvolatile memory express (NVMe), but example embodiments are not limited thereto.

The image capturing device 741 may capture still images or videos and may be a camera, a camcorder, and/or a webcam.

The user input device 742 may receive various types of data input from a user of the system 700, and may be a touchpad, a keypad, a keyboard, a mouse, and/or a microphone.

The sensor 743 may detect various types of physical quantities that may be obtained from the outside of the system 700, and may convert the detected physical quantities into electrical signals. The sensor 743 may include a temperature sensor, a pressure sensor, an illuminance sensor, a position sensor, an acceleration sensor, a biosensor, and/or a gyroscope sensor.

The communication device 744 may transmit and receive signals between other devices outside the system 700 based on various communication protocols. The communication device 744 may be implemented to include an antenna, a transceiver, and/or a modem.

The display 745 and speaker 746 may function as output devices to output visual information and auditory information to the user of the system 700, respectively.

The power supply device 747 may appropriately convert power supplied from an internal battery, not illustrated, and/or external power, and may supply the converted power to each component of the system 700.

The connection interface 748 may provide a connection between the system 700 and an external device connected to the system 700 to exchange data with the system 700. The connection interface 748 may be implemented in various interface schemes such as an advanced technology attachment (ATA), a serial ATA (SATA), an external SATA (e-SATA), a small computer system interface (SCSI), a serial attached SCSI (SAS), a peripheral component interconnect (PCI), a PCI express (PCIe), an NVMe, an IEEE 1394, a universal serial bus (USB), a secure digital (SD) card interface, a multimedia card (MMC) interface, an embedded MMC (eMMC) interface, a universal flash storage (UFS) interface, an embedded UFS (eUFS) interface, or a compact flash (CF) card interface.

The system according to the above-described embodiments may operate at low power using the memories 720*a* to 720*b* that may independently divide the frequency of a common clock signal for each sub-channel.

As set forth above, according to example embodiments, an input/output interface circuit for dividing a common clock signal for each sub-channel and a memory system including the same may be provided.

While example embodiments have been shown and described above, it will be apparent to those skilled in the art that modifications and variations could be made without departing from the scope of the appended claims.

What is claimed is:

1. An input/output interface circuit comprising:

a common receiving driver configured to receive a differential clock signal and output a first clock signal corresponding to the differential clock signal; and a pair of sub-channels connected to the common receiving driver, wherein:

each sub-channel of the pair of sub-channels is configured to receive the first clock signal, a chip select signal, a second clock signal, a logical AND operation, a single clock signal, one or more divided clock signals, and a command address signal are separately defined for each sub-channel, each sub-channel is configured to receive the chip select signal, each sub-channel is configured to output the second clock signal through the logical AND operation of the first clock signal and the chip select signal to provide the single clock signal, wherein the single clock signal is provided from among: i) the second clock signal and ii) the one or more divided clock signals, wherein the one or more divided clock signals are divided from the second clock signal, and the single clock signal is configured to sample the command address signal.

2. The input/output interface circuit of claim 1, wherein each sub-channel of the pair of sub-channels comprises:

a first sub-channel driver configured to receive the chip select signal;

a first logic circuit configured to perform the logical AND operation on the first clock signal and the chip select signal; and a clock divider configured to generate the one or more divided clock signals from the second clock signal.

3. The input/output interface circuit of claim 2, wherein each sub-channel of the pair of sub-channels further comprises a multiplexer configured to select the single clock signal from among the second clock signal and the one or more divided clock signals, based on a control signal.

4. The input/output interface circuit of claim 3, wherein each sub-channel of the pair of sub-channels further comprises:

a second sub-channel driver configured to receive the command address signal; and a first flip-flop configured to store the command address signal based on the single clock signal.

5. The input/output interface circuit of claim 4, wherein each sub-channel of the pair of sub-channels further comprises:

a first buffer connected between the multiplexer and the first flip-flop; and a second buffer connected between the second sub-channel driver and the first flip-flop.

6. The input/output interface circuit of claim 2, wherein the clock divider comprises one or more unit dividers, sequentially connected to each other from an output of the first logic circuit.

7. The input/output interface circuit of claim 1, wherein the one or more divided clock signals are divided by $2^N$ (where N is a positive integer) from the second clock signal.

8. The input/output interface circuit of claim 3, wherein the control signal is a mode register write signal.

9. The input/output interface circuit of claim 4, wherein each sub-channel of the pair of sub-channels further comprises a second flip-flop configured to store the chip select signal based on the single clock signal.

10. The input/output interface circuit of claim 9, wherein each sub-channel of the pair of sub-channels further comprises:

a replica delay cell connected between an output terminal of the first sub-channel driver and the second flip-flop; and a second logic circuit configured to perform a logical AND operation on the command address signal and the chip select signal.

11. The input/output interface circuit of claim 10, wherein each sub-channel of the pair of sub-channels further comprises a buffer connected between the replica delay cell and the second flip-flop.

12. An input/output interface circuit comprising:

a common receiving driver configured to receive a differential clock signal and output a first clock signal corresponding to the differential clock signal; and a first sub-channel and a second sub-channel connected to the common receiving driver, wherein:

the first sub-channel is configured to receive the first clock signal and a first chip select signal, output a 2-1-th clock signal through a first logical AND operation of the first clock signal and the first chip select signal, output a first single clock signal provided from among: i) the 2-1-th clock signal and ii) one or more first divided clock signals, wherein the one or more first divided clock signals are divided from the 2-1-th clock signal, and sample a first command address signal using the first single clock signal, and the second sub-channel is configured to receive the first clock signal and a second chip select signal, output a 2-2-th clock signal through a second logical AND operation of the first clock signal and the second chip select signal, and output a second single clock signal provided from among: i) the 2-2-th clock signal and ii) one or more second divided clock signals, wherein the one or more second divided clock signals are divided from the 2-2-th clock signal, and sample a second command address signal using the second single clock signal.

13. The input/output interface circuit of claim 12, wherein the first sub-channel comprises:

a 1-1-th sub-channel driver configured to receive the first chip select signal;

a logic circuit configured to perform the first logical AND operation on the first clock signal and the first chip select signal;

a clock divider configured to generate the one or more first divided clock signals from the 2-1-th clock signal; and a multiplexer configured to select, based on a control signal, the first single clock signal from among the 2-1-th clock signal and the one or more first divided clock signals.

14. The input/output interface circuit of claim 13, wherein the first sub-channel further comprises:

a 2-1-th sub-channel driver configured to receive the first command address signal; and a flip-flop configured to store the first command address signal based on the first single clock signal.

15. The input/output interface circuit of claim 13, wherein the control signal is a mode register write signal.

16. The input/output interface circuit of claim 12, wherein the one or more second divided clock signals are divided by $2^N$ (where N is a positive integer) from the 2-1-th clock signal and the 2-2-th clock signal.

17. A memory system comprising:

a system-on-chip (SoC) comprising a first input/output interface circuit; and a memory device comprising a second input/output interface circuit communicating with the first input/output interface circuit, wherein the second input/output interface circuit comprises:

a common receiving driver configured to receive a differential clock signal through the first input/output interface circuit and output a first clock signal corresponding to the differential clock signal; and a pair of sub-channels connected to the common receiving driver, and each sub-channel of the pair of sub-channels is configured to receive the first clock signal through the common receiving driver, a chip select signal, a second clock signal, a logical AND operation, a single clock signal, one or more divided clock signals, and a command address signal are separately defined for each sub-channel, each sub-channel is configured to receive the chip select signal, each sub-channel is configured to output the second clock signal through the logical AND operation of the first clock signal and the chip select signal to provide the single clock signal, wherein the single clock signal is provided from among: i) the second clock signal and ii) the one or more divided clock signals, wherein the one or more divided clock signals are divided from the second clock signal, and the single clock signal is configured to sample the command address signal.

18. The memory system of claim 17, wherein the first input/output interface circuit comprises a transmission driver corresponding to the common receiving driver.

19. The memory system of claim 17, wherein each sub-channel of the pair of sub-channels comprises:

a first sub-channel driver configured to receive the chip select signal;

a logic circuit configured to perform the logical AND operation on the first clock signal and the chip select signal; and a clock divider configured to generate the one or more divided clock signals from the second clock signal.

20. The memory system of claim 19, wherein each sub-channel of the pair of sub-channels further comprises a multiplexer configured to select the single clock signal from among the second clock signal and the one or more divided clock signals, based on a control signal.

* * * * *